US012745609B2

(12) United States Patent
Escoffier et al.

(10) Patent No.: US 12,745,609 B2
(45) Date of Patent: Sep. 22, 2026

(54) TEST VEHICLE AND TEST METHOD FOR MICROELECTRONIC DEVICES

(71) Applicant: COMMISSARIAT A L'ENERGIE ATOMIQUE ET AUX ENERGIES ALTERNATIVES, Paris (FR)

(72) Inventors: René Escoffier, Grenoble Cedex (FR); Blend Mohamad, Grenoble Cedex (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 681 days.

(21) Appl. No.: 18/061,750

(22) Filed: Dec. 5, 2022

(65) Prior Publication Data

US 2023/0230888 A1 Jul. 20, 2023

(30) Foreign Application Priority Data

Dec. 7, 2021 (FR) ..................................... 21 13071

(51) Int. Cl.

| | |
|---|---|
| ***H10P 74/00*** | (2026.01) |
| ***G01R 31/26*** | (2020.01) |
| ***H10D 30/47*** | (2025.01) |
| ***H10D 64/23*** | (2025.01) |
| ***H10D 64/27*** | (2025.01) |

(52) U.S. Cl.

CPC ........ *H10P 74/273* (2026.01); *G01R 31/2607* (2013.01); *H10D 30/475* (2025.01); *H10D 64/256* (2025.01); *H10D 64/513* (2025.01)

(58) Field of Classification Search

CPC ........ H10D 30/471–478; H01L 29/778; H01L 22/32; H10P 74/273

See application file for complete search history.

(56) References Cited

U.S. PATENT DOCUMENTS

| | | | |
|---|---|---|---|
| 6,072,209 | A | 6/2000 | Noble et al. |
| 2010/0025730 | A1 | 2/2010 | Heikman et al. |
| 2011/0263102 | A1 | 10/2011 | Heikman et al. |

(Continued)

FOREIGN PATENT DOCUMENTS

| | | | | | |
|---|---|---|---|---|---|
| CN | 110739350 | A | * | 1/2002 | ............. H01L 22/14 |
| CN | 111668127 | A | * | 9/2020 | ............. H10D 30/47 |
| JP | 2021125659 | A | * | 8/2021 | |

OTHER PUBLICATIONS

Machine translation of JP 2021125659 (Year: 2025).*

(Continued)

*Primary Examiner* — Lauren R Bell

(74) *Attorney, Agent, or Firm* — Oblon, McClelland, Maier & Neustadt, L.L.P.

(57) ABSTRACT

A test structure for a buried gate transistor includes a substrate, a first test contact located on one side of a first transistor contact, a second test contact located on one side of a second transistor contact, and a layer buried in the substrate, having a doping greater than or equal to $10^{18}$ $cm^{-3}$, and having a face which is tangent to the buried part of the gate. A first insulation structure is disposed between the first test contact and the first transistor contact and a second insulation structure is disposed between the second test contact and the second transistor contact. The first and second test contacts each have an end connected to the buried layer.

14 Claims, 6 Drawing Sheets

(56) References Cited

U.S. PATENT DOCUMENTS

| | | | | |
|---|---|---|---|---|
| 2012/0235160 | A1 | 9/2012 | Heikman et al. | |
| 2022/0359334 | A1* | 11/2022 | Cheng | H01L 23/3171 |
| 2022/0392887 | A1* | 12/2022 | Yanagihara | H10D 8/60 |

OTHER PUBLICATIONS

Jiang et al., "SiC Trench MOSFET With Shielded Fin-Shaped Gate to Reduce Oxide Field and Switching Loss", IEEE Electron Device Letters, vol. 37 Issue: 10, 2016, 1 Page (English abstract).

Baliga et al., "Power semiconductor device figure of merit for high-frequency applications", IEEE Electron Device Letters, vol. 10 Issue: 10, 1989, 1 Page (English abstract).

* cited by examiner

TEST VEHICLE AND TEST METHOD FOR MICROELECTRONIC DEVICES

TECHNICAL FIELD

The present invention relates to the field of microelectronics. It has a particularly advantageous application in measuring resistivity in vertical transistor structures. A particular example of an application relates to two-dimensional electron gas (2DEG) buried gate power transistors.

STATE OF THE ART

Vertical metal-oxide-semiconductor (MOS)-type transistor structures generally have a buried or semi-buried gate, the sides of which can contribute to the conduction path. The sides of the gate can be typically inclined or vertical.

Different silicon-, silicon carbide- or gallium nitride-based vertical transistor architectures are disclosed in the documents, "SiC Trench MOSFET With Shielded Fin-Shaped Gate to Reduce Oxide Field and Switching Loss, IEEE Electron Device Letters, Volume: 37, Issue: 10, October 2016 p. 1324-1327" and "The trench power MOSFET: Part I—History, technology, and prospects, IEEE Transactions on Electron Devices, Volume: 64, Issue: 3, March 2017 p. 674-891".

A challenge linked to the study of such transistors in terms of resistance value in the on state, relates to measuring resistivity or resistance along the conduction path.

FIG. 1 illustrates the different resistance components $R_{on}$ along the conduction path (C) between the source 21 and the drain 22 of a transistor 2 based on the use of a two-dimensional electron gas (2DEG). The 2DEG is, in this case, typically confined by piezoelectric effect under the interface between the barrier layer 31 and the substrate 20. The resistance $R_{on}$ can be broken down according to:

$$R_{on}=R_{C1}+R_{2DEG1}+R_{T1}+R_{Channel}+R_{T2}+R_{2DEG2}+R_{C2}$$

With $R_{on}$ the total resistance, $R_{C1}$, $R_{C2}$ the source and drain contact resistances, $R_{Channel}$ the resistance of the channel under the gate, $R_{T1}$, $R_{T2}$ the resistances along the sides of the gate, and $R_{2DEG1}$, $R_{2DEG2}$ the resistances in the 2DEG.

Conventional methods for measuring resistivity are typically measurements based on a transfer line model (TLM), measurements by Hall effect. Van der Pauw-type measurements, or four point measurements.

The TLM method requires a test structure typically comprising four contacts separated by increasing separation distances.

The Hall effect measurement typically requires four electrodes and the application of a magnetic field at the analysed transistor.

The Van der Pauw and four point measurements are variants requiring four electrodes placed according to particular geometries.

The TLM method combined with measuring the total resistance $R_{on}$ of the transistor makes it possible to obtain: $R_{T1}+R_{T2}+R_{channel}$, by subtracting the resistances from the 2DEG and from the contacts at the total resistance measured on the transistor.

The Van de Pauw method makes it possible to determine the $R_{channel}$ value. The known methods thus make it possible to obtain the value $R_{T1}+R_{T2}$, and consequently the average value $R_T$ substantially corresponding to the resistance in the conduction path along a side of the buried part of the gate.

It is however not possible to separate the two components of resistances $R_{T1}$ and $R_{T2}$, along each of the sides of the buried part of the gate, the sum of which is equal to $2R_T$. Yet, the precise determination of these two components $R_{T1}$ and $R_{T2}$ has a particular interest in the characterisation of the electrostatic properties of the transistor and of the interface states of the sides of the gate. The precise determination of $R_{T1}$ and $R_{T2}$ would make it possible, for example, to consider technological solutions minimising the total resistance $R_{on}$.

The determination of the different components of $R_{on}$ at each of the portions of the gate is therefore a significant challenge. There is a need consisting of proposing a method and a test structure surmounting the disadvantages mentioned above.

An aim of the present invention is to propose a test structure making it possible to separate the contributions of the two sides of a buried gate by separately and precisely measuring $R_{T1}$ and $R_{T2}$.

Another aim of the present invention is to propose a test method making it possible to separately determine $R_{T1}$ and $R_{T2}$.

Other aims, features and advantages of the present invention will appear upon examining the following description and the accompanying drawings. It is understood that other advantages can be incorporated.

SUMMARY

To achieve this aim, according to an embodiment, a test structure for a buried gate transistor is provided, said transistor comprising:

- A substrate,
- A gate having a part buried in the substrate.
- A gate dielectric electrically insulating the gate from the substrate,
- A first transistor contact located on a first side of the gate and having a first end connecting a conduction path in the substrate,
- A second transistor contact located on a second side of the gate, opposite the first side, and having a second end connecting the conduction path in the substrate.

The test structure comprises:

- A first test contact located on one side of the first transistor contact opposite the gate,
- A second test contact located on one side of the second transistor contact opposite the gate.

Advantageously, the test structure further comprises:

- a layer buried in the substrate, having a doping greater than or equal to 10ˆ18 $cm^{-3}$, for example, of between 10ˆ19 and 10ˆ20 $cm^{-3}$, and having a face which is tangent to the buried part of the gate,
- a first insulation structure configured to electrically insulate the first test contact and the first transistor contact from each other,
- a second insulation structure configured to electrically insulate the second test contact and the second transistor contact from each other.

Advantageously, the first and second test contacts, each having an end connecting the buried layer.

Such a test structure advantageously makes it possible to establish an electrical conduction path between the first transistor contact and the first test contact, passing through the buried layer and the first side of the gate.

As illustrated in FIG. 3, by positively polarising along $V_{ss}$ the first test contact 11 vis-à-vis the first transistor contact 21, a current I1 is established and it is thus possible to measure the resistance $R_{T1}$ along the first side 241 of the gate 23, according to:

$$R_{T1} = \frac{V_{SS}}{I_1} - R_{2DEG1} - R_{C1} - R_{CT1} - R_{dop1}$$

With $V_{ss}$ the polarisation voltage between the first test contact and the first transistor contact, $I_1$ the electrical current, $R_{C1}$ the resistance at the first transistor contact, $R_{CT1}$ the resistance at the first test contact, $R_{2DEG1}$ the resistance in the 2DEG between the gate and the first transistor contact, and $R_{dop1}$ the resistance in the buried layer between the gate and the first test contact.

The test structure also makes it possible to separately measure the resistance $R_{T2}$ along the second side of the gate, by negatively polarising along $V_{DD}$ the second test contact vis-à-vis the second transistor contact, similarly to the measurement of $R_{T1}$.

$$R_{T2} = \frac{VDD}{I_2} - R_{2DEG2} - R_{C2} - R_{CT2} - R_{dop2}$$

With $V_{DD}$ the polarisation voltage between the second test contact and the second transistor contact, $I_2$ the electrical current, $R_{C2}$ the resistance at the second transistor contact. $R_{CT2}$ the resistance at the second test contact, $R_{2DEG2}$ the resistance in the 2DEG between the gate and the second transistor contact, and $R_{dop2}$ the resistance in the buried layer between the gate and the second test contact.

The test structure according to the invention therefore makes it possible to separately determine the resistances $R_{T1}$ and $R_{T2}$ along each of the side of the buried part of the gate.

According to a possibility, the test structure also makes it possible to determine Rct1+Rdop1 (and equivalently Rct2+Rdop2) by positively polarising the first test contact vis-à-vis the second test contact, without polarising the first and second transistor contacts, nor the gate.

According to another aspect of the invention, a test method is provided implementing a test structure according to the embodiment summarised above, comprising the following steps:

- Polarising the gate at a gate voltage Vg of between 0 and 15V,
- Positively polarising the first test contact vis-à-vis the first transistor contact, without polarising the second test contact, nor the second transistor contact, so as to determine a first resistance value RT1 along a first side of the buried part of the gate,
- Negatively polarising the second test contact vis-à-vis the second transistor contact, without polarising the first test contact, nor the first transistor contact, so as to determine a second resistance value RT2 along a second side of the buried part of the gate.

A first conduction path is thus advantageously established between the first test contact and the first transistor contact, making it possible to determine the resistance $R_{T1}$, then a second conduction path is advantageously established between the second test contact and the second transistor contact, making it possible to determine the resistance $R_{T2}$.

BRIEF DESCRIPTION OF THE FIGURES

The aims, objectives, as well as the features and advantages of the invention will best emerge from the detailed description of embodiments of the latter, which are illustrated by the following accompanying drawings, wherein.

Figure 1:
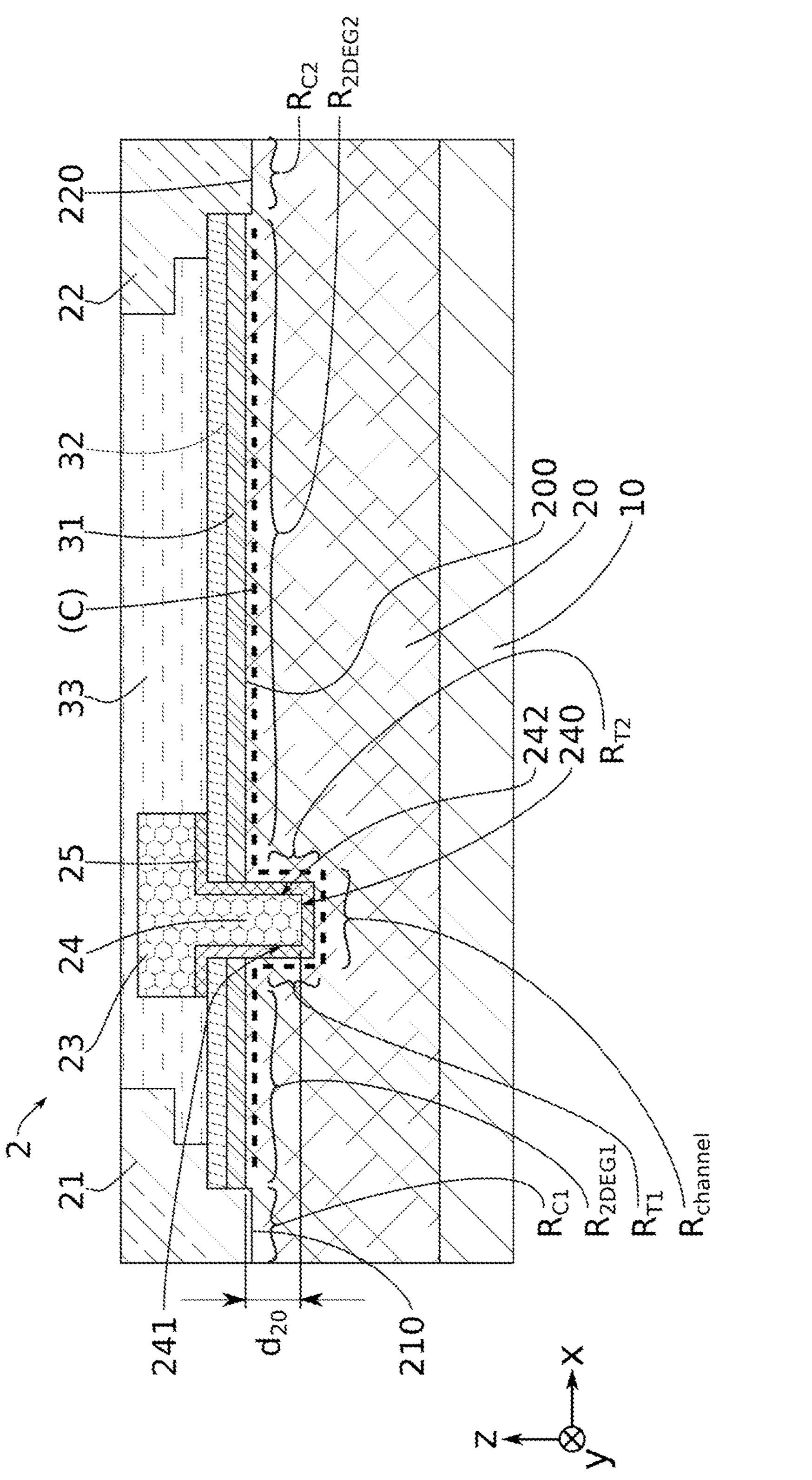
FIG. 1 schematically illustrates a buried gate transistor according to an embodiment of the present invention. The resistances along different portions of the conduction path are indicated.

The drawings are given as examples and are not limiting of the invention. They constitute principle schematic representations intended to facilitate the understanding of the invention and are not necessarily to the scale of practical applications. In particular, in the principle diagrams, the thicknesses of the different layers, and the dimensions of the different patterns (gate, source, drain, etc,) are not representative of reality.

DETAILED DESCRIPTION

Before starting a detailed review of embodiments of the invention, optional features are stated below which can optionally be used in association or alternatively:

According to an example, the test structure for a buried gate transistor comprises said transistor.

According to an example, the first and second insulation structures respectively comprise first and second amorphous zones.

According to an example, the first and second insulation structures respectively comprise first and second wells based on a dielectric material.

According to an example, the first and second insulation structures respectively comprise first and second gates disposed on the surface of the substrate. These gates are typically separated from the surface of the substrate by a dielectric layer. They are not necessarily directly in contact with the surface of the substrate.

According to an example, the face of the buried layer passes within the gate dielectric under an end of the buried gate. This face is configured to be in the immediate proximity of the bottom end of the gate, typically at the portion of the conduction path corresponding to $R_{Channel}$. At close manufacturing tolerances, this face can be substantially tangent to the bottom end of the gate or at the bottom end of the gate dielectric, or between the two planes containing these two bottom ends, within the gate dielectric.

According to an example, the buried gate transistor comprises a barrier layer on the substrate configured to form a two-dimensional electron gas (2DEG) confined under said barrier layer, in the substrate.

According to an example, the 2DEG gas forms the conduction path, the first and second transistor contacts passing through said barrier layer.

According to an example, the substrate is GaN-based, and the buried layer is N doped GaN-based.

According to an alternative example, the substrate is silicon- or silicon carbide-based.

According to an example, the buried layer has a thickness $e_{30}$ greater than or equal to 100 nm.

According to an example, the first and second transistor contacts are disposed symmetrically on either side of the gate.

According to an example, the first and second test contacts are disposed symmetrically on either side of the gate.

According to an example, the test structure comprises a buried gate transistor, said transistor comprising:

A substrate,

A gate having a part buried in the substrate,

A gate dielectric electrically insulating the gate from the substrate,

A first transistor contact located on a first side of the gate and having a first end connecting a conduction path in the substrate, A second transistor contact located on a second side of the gate, opposite the first side, and having a second end connecting the conduction path in the substrate, And the test structure comprises:

A first test contact located on one side of the first transistor contact opposite the gate, A second test contact located on one side of the second transistor contact opposite the gate, A layer buried in the substrate, having a doping greater than or equal to $10^{18}$ $cm^{-3}$, for example of between $10^{19}$ and $10^{20}$ $cm^{-3}$, and having a face which is tangent to the buried part of the gate, A first insulation structure configured to electrically insulate the first test contact and the first transistor contact, A second insulation structure configured to electrically insulate the second test contact and the second transistor contact, the first and second test contacts each having an end connecting to the buried layer.

According to an example, the method further comprises:

Positively polarising the first test contact vis-à-vis the second test contact, without polarising the first and second transistor contacts nor the gate, so as to determine a resistance value, typically 2.RCT+2.Rdop, of the layer buried between the first and second test contacts.

According to an example, the method further comprises:

During the determination of the first resistance value RT1, negatively polarising the first gate of the first insulation structure, below a first threshold voltage Vth1, so as to block an electrical current flow between the first test contact and the first transistor contact, During the determination of the second resistance value RT2, negatively polarising the second gate of the second insulation structure, below a second threshold voltage Vth2, so as to block an electrical current flow between the second test contact and the second transistor contact.

Unless incompatible, technical features described in detail for a given embodiment can be combined with the technical features described in the context of other embodiments described as an example and in a non-limiting manner, so as to form another embodiment which is not necessarily illustrated or described. Such an embodiment is obviously not excluded from the invention.

In the scope of the present invention, the power transistor architectures considered are typically buried gate in the substrate. Some of these architectures are more specifically based on a principle of conduction by two-dimensional electron gas (2DEG).

Such a transistor architecture includes the superposition of two semi-conductive layers having different band gaps which form a quantum well at their interface. Electrons are confined in this quantum well to form a two-dimensional electron gas.

HEMT (High Electron Mobility Transistor)-type transistors, sometimes also called heterostructure field effect transistors, are examples of transistors based on this two-dimensional electron gas architecture.

For power (in particular, high voltage) and temperature holding reasons, the semi-conductive material of these transistors is preferably chosen so as to have a wide energy band gap. From among wide energy band gap HEMT transistors, gallium nitride-based transistors are generally preferred.

In the scope of the present invention, the flow of the current is typically controlled by a gate positively polarised with respect to the source.

This gate can be of the MOS or MOSFET (Metal Oxide Semiconductor Field Effect Transistor) type, or also more generally, MIS or MISFET (Metal Insulator Transistor) type. In this case, the metal gate is electrically insulated from the semi-conductive layers by a gate dielectric. Other gate compositions can be considered. A particularity of the transistor architectures according to the present invention is that the gate passes through the quantum well at which the two-dimensional electron gas is confined. The continuity of the two-dimensional electron gas is thus broken by a trench, wherein the MOS gate of the transistor is produced.

Generally, if the gate of the transistor is put at a voltage greater than a threshold voltage, the source and the drain are connected by the two-dimensional electron gas and the transistor is called on.

If the gate of the transistor is put at a voltage less than the threshold voltage, the source and the drain are no longer connected and the transistor is called off.

The buried gate HEMT transistors considered in the scope of the invention are preferably in the off state when the gate is not polarised. This type of transistor operation is commonly called "normally off".

It is specified that, in the scope of the present invention, the terms "on". "surmounts", "covers", "underlying". "vis-à-vis" and their equivalents do not necessarily mean "in contact with". Thus, for example, the deposition of a first layer on a second layer, does not compulsorily mean that the two layers are directly in contact with one another, but means that the first layer covers at least partially the second layer by being either directly in contact with it, or by being separated from it by at least one other layer or at least one other element.

For example, and in a manner known per se, in the field of GaN-based HEMT-type transistors, a thin AlN layer can be inserted between two GaN and AlGaN semi-conductive layers.

A layer can moreover be composed of several sub-layers of one same material or of different materials.

By a substrate, a stack, a layer, "based on" a material A or "A-based", this means a substrate, a stack, a layer comprising this material A only or this material A and optionally other materials, for example alloy elements and/or doping elements.

The doping ranges associated with the different doping types indicated in the present application are as follows:

p++ or n++ doping: greater than 1×10^20 $cm^{-3}$ p+ or n+ doping: 1×10^18 $cm^{-3}$ to 9×10^19 $cm^{-3}$ p or n doping: 1×10^17 $cm^{-3}$ to 1×10^18 $cm^{-3}$ intrinsic or unintentionally doped doping: 1·10^15 $cm^{-3}$ to 1·10^17 $cm^{-3}$ A preferably orthonormal marker, comprising the axes x, y, z is represented in the accompanying figures. When only one marker is represented in one same set of figures, this marker applies to all the figures of this set.

In the present patent application, the thickness of a layer is taken in a direction normal to the main extension plane of the layer. Thus, a layer typically has a thickness along z. The relative terms "on", "surmounts", "under", "underlying" refer to positions taken in the direction z.

The terms "vertical", "vertically" refer to a direction along z. The terms "horizontal", "horizontally" refer to a direction in the plane xy.

An element located "in vertical alignment with" or "to the right of" another element means that these two elements are both located on one same line perpendicular to a plane wherein a lower or upper face of a substrate mainly extends, i.e. on one same line oriented vertically in the figures.

An example of a buried gate transistor 2 according to the present invention is illustrated in FIG. 1. The general architecture of this HEMT-type transistor 2 comprises a first contact, for example a source 21 and a second contact, for example a drain 22 formed on either side of a gate pattern or gate 23. The gate 23 extends partially through a stack of layers 32, 31, until the substrate 20. This transistor 2 is based on a principle of conduction by two-dimensional electron gas (2DEG). Other types of buried gate transistors can also be considered.

The substrate 20 can be a GaN-based substrate. Known GaN on sapphire or GaN on silicon substrates can typically be used. The support 10 can thus comprise, in a known manner, a silicon bulk part and one or more buffer layers inserted between the silicon part and the GaN-based substrate 20. The substrate 20 is typically unintentionally doped.

A barrier layer 31, typically AlGaN-based, is directly disposed on the surface 200 of the substrate 20. This barrier layer 31 has a thickness, for example, of between 20 nm and 100 nm.

In a known manner, a two-dimensional electron gas is formed under the AlGaN-based barrier layer 31, in the GaN-based substrate 20. The two-dimensional electron gas 2DEG is typically confined at the interface between the AlGaN-based barrier layer 31 and the GaN-based substrate 20. This two-dimensional electron gas 2DEG forms a conduction path (C) in the substrate 20.

A dielectric layer 32, for example silicon nitride SiN-based, is typically disposed on the barrier layer 31.

An encapsulation layer 33, for example silicon oxide SiO2-based, can be typically formed on the layer 32, between the contacts 21, 22 and the gate 23, so as to insulate the contacts and the gate together, and to flatten the structure.

In a known manner, the stack of layers 31, 32 at the surface 200 of the substrate 20 can comprise other layers, for example a thin AlN-based layer between the substrate 20 and the barrier layer 31.

The gate 23 is typically disposed on this stack of layers 31, 32, and comprises a part 24 passing through the stack and extending until the substrate 20, called buried part 24. The buried part 24 of the gate 23 has a lower end 240, and this lower end 240 is located at a depth d20 along z, in the substrate 20, with respect to the surface 200 of the substrate 20. The end 240 can be located at a depth d20 of between 20 nm and 100 nm. The buried part 24 of the gate 23 typically has a first side 241, for example substantially vertical, and a second side 242, for example substantially vertical, under the surface 200 of the substrate 20. The gate 23, 24 can be with the basis of a metal alloy, for example gold- and/or platinum- and/or titanium-based.

A gate dielectric 25 typically separates the gate 23, 24 from the stack of layers 31, 32 and from the substrate 20. This gate dielectric 25 is, for example, alumina Al2O3-based, and has a thickness of around a few nanometres to a few tens of nanometres, for example around 30 nm.

The buried part 24 of the gate 23 is configured to cut off the two-dimensional electron gas along the conduction path (C). Controlling the gate voltage Vg makes it possible to enable or block the flow of the electrons of the two-dimensional electron gas on either side of the gate 23. The gate voltage Vg making it possible to enable the flow of the electrons is, in this case, typically positive, for example of between 0V and 15V. According to an example, the gate voltage Vg making it possible to enable the flow of the electrons is of between 0V and 6V. In the absence of polarisation of the gate 23, this type of transistor 2 is configured such that the flow of the electrons is blocked. This type of transistor 2 is called "normally off".

The source and drain contacts 21, 22 respectively have an end 210, 220 directly in contact with the substrate 20. The first transistor contact 21 is typically located on the side of the first side 241, and the second transistor contact 22 is typically located on the side of the second side 242.

The total resistance $R_{on}$ of the transistor 2 can be broken down along the different portions of the conduction path (C) from the source 21 up to the drain 22, as follows:

$$R_{on}=R_{C1}+R_{2DEG1}+R_{T1}+R_{Channel}+R_{T2}+R_{2DEG2}+R_{C2}$$

With $R_{C1}$ the contact resistance at the first contact 21, $R_{2DEG1}$ the resistance in the 2DEG gas between the first contract 21 and the buried part 24 of the gate 23, $R_{T1}$ the resistance along the first side 241 of the buried part 24 of the gate 23, $R_{Channel}$ the resistance under the end 240 of the buried part 24 of the gate 23, $R_{T2}$ the resistance along the second side 242 of the buried part 24 of the gate 23, $R_{2DEG2}$ the resistance in the 2DEG gas between the buried part 24 of the gate 23 and the second contact 22, and $R_{C2}$ the contact resistance at the second contact 22.

Figure 2:
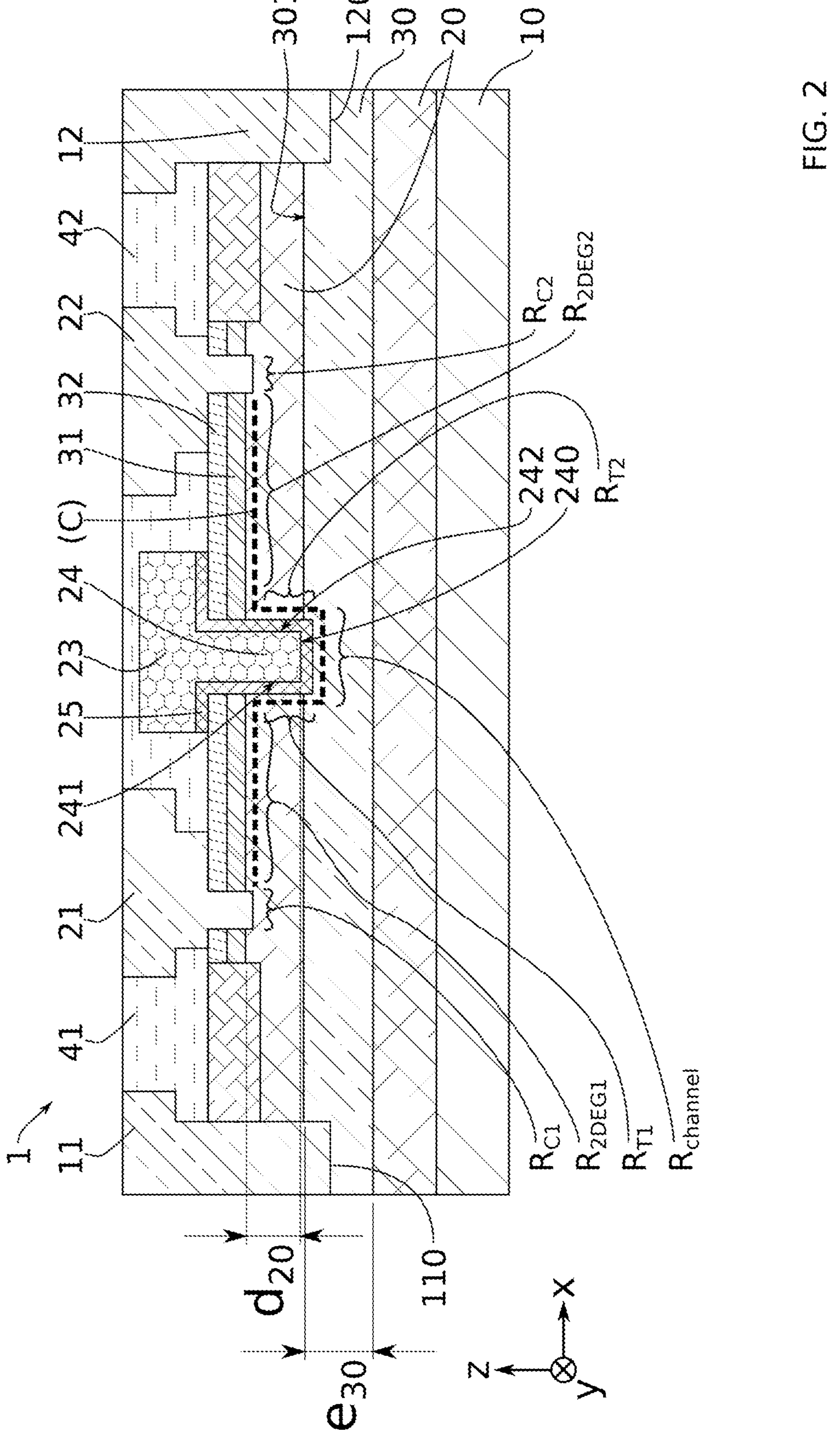
FIG. 2 schematically illustrates a test structure according to an embodiment of the present invention.

As illustrated in FIG. 2, a test structure 1 dedicated to measuring components $R_{T1}$, $R_{T2}$ of the transistor 2 is proposed.

The test structure 1 typically comprises first and second test contacts 11, 12, and a layer 30 buried in the substrate 20. The first and second test contacts 11, 12 typically flank the transistor 2. In particular, the test structure 1 is configured such that the gate 23, 24 and the transistor contacts 21, 22 are located between the first and second test contacts 11, 12.

In this configuration, the first transistor contact 21 is located between the first test contact 11 and the gate 23. The second transistor contact 22 is located between the second test contact 12 and the gate 23.

The first and second test contacts 11, 12 extend into the substrate 20 up to the buried layer 30. They each have an end 110, 120 located within the buried layer 30. The first and second test contacts 11, 12 are respectively electrically insulated vis-à-vis the first and second transistor contacts 21, 22, by insulation structures 41, 42.

The buried layer 30 is electrically conductive. It is typically with the basis of a highly doped semiconductor, typically having a doping greater than $10^{18}$ $cm^{-3}$, for example of between $10^{19}$ and $10^{20}$ $cm^{-3}$. Thus, for a GaN-based substrate 20, an n+ or n++ doped GaN-based buried layer 30 is advantageously chosen, in order to preserve the crystalline quality of the substrate 20. Such a layer 30 can be produced during the epitaxy of the substrate 20 by Metal Organic Chemical Vapour Deposition (MOCVD) growth, typically by incorporating silicon. Silicon is an n-type dopant (donor atoms) for GaN. The doping of GaN by silicon can be done during growth at 1050° C., without it being necessary to perform activation annealing. The buried layer 30 has a thickness $e_{30}$ along z, preferably greater than 100 nm, for example of between 100 and 400 nanometres. The resistances $R_{dop1}$, $R_{dop2}$, linked to this layer 30 are lower than the doping is high, and lower than the thickness $e_{30}$ is thick.

The buried layer 30 has an upper face 301 configured to make the end 240 tangent to the buried part 24 of the gate 23. According to a possibility, the face 301 passes within the dielectric 25 located under the end 240 of the gate. According to another possibility, the face 301 is tangent to the end 250 of the gate dielectric 25. The positioning of the face 301 of the layer 30 is chosen such that the layer 30 intercepts the conduction path of the transistor 2, at the lowest portion of the conduction path corresponding to $R_{Channel}$. The tangential position of this face 301 vis-à-vis the end of the gate 24 or of the gate dielectric 25 makes it possible to preserve all or most of the portions of the conduction path corresponding to $R_{T1}$, $R_{T2}$ along the sides 241, 242 of the buried part 24 of the gate. This makes it possible to improve the precision on measuring the values $R_{T1}$, $R_{T2}$. The precision on the positioning in depth of the face 301 vis-à-vis of the ends 240, 250 is typically of around a few nanometres, for example less than 5 nm, and preferably less than 2 nm.

According to a possibility, the test structure 1 comprising the transistor 2 has a symmetry with respect to the gate 23. As illustrated in FIG. 2, the transistor contacts 21, 22 are preferably equidistant from the gate 23. In this case, $R_{2DEG1} \approx R_{2DEG2}$. The test contacts 11, 12 are preferably equidistant from the gate 23. In this case, $R_{dop1} \approx R_{dop2}$.

The insulation structures 41, 42 are configured to respectively electrically insulate the test contacts 11, 12 vis-à-vis the transistor contacts 21, 22. Several embodiments of these insulation structures 41, 42 are described below.

Figure 3:
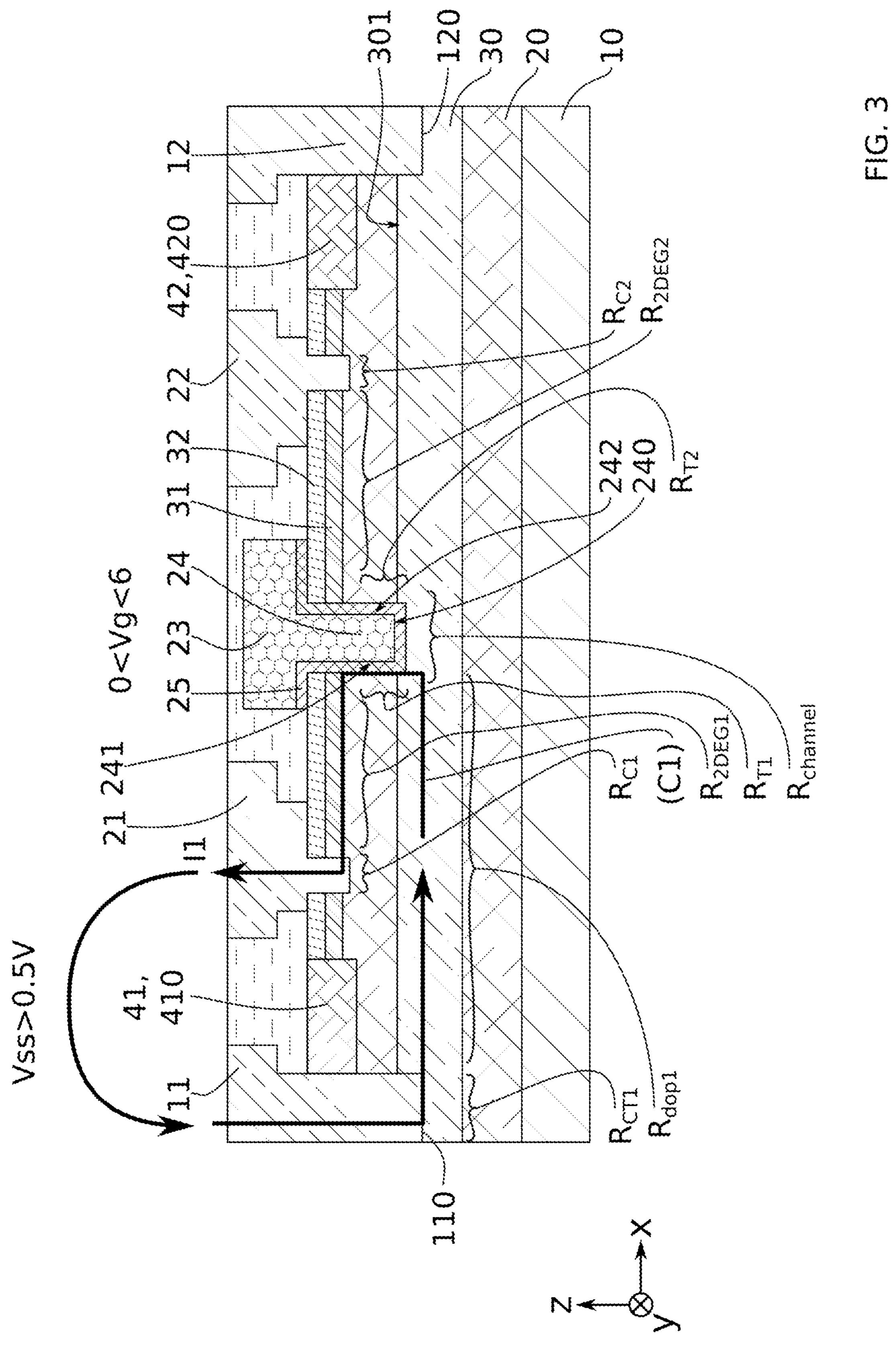
FIG. 3 schematically illustrates a first conduction path in the test structure illustrated in FIG. 2, according to an embodiment of the present invention.

FIG. 3 illustrates an embodiment where the insulation structures 41, 42 are typically formed by argon implantation through the layers 31, 32, until the substrate 20. This implantation is configured to locally amorphise the zones 410, 420 extending through the layers 31, 32, and partially in the substrate 20 over a depth greater than the confinement thickness of the 2DEG. Thus, the two-dimensional electron gas is destroyed at the insulation zones 41, 42. There is therefore no conduction path between the first test contact 11 and the first transistor contact 21 on the one hand, and between the second test contact 12 and the second transistor contact 22 on the other hand. Such an implantation can be achieved via an implantation energy of several tens of keV, typically around 60 keV.

Figure 4:
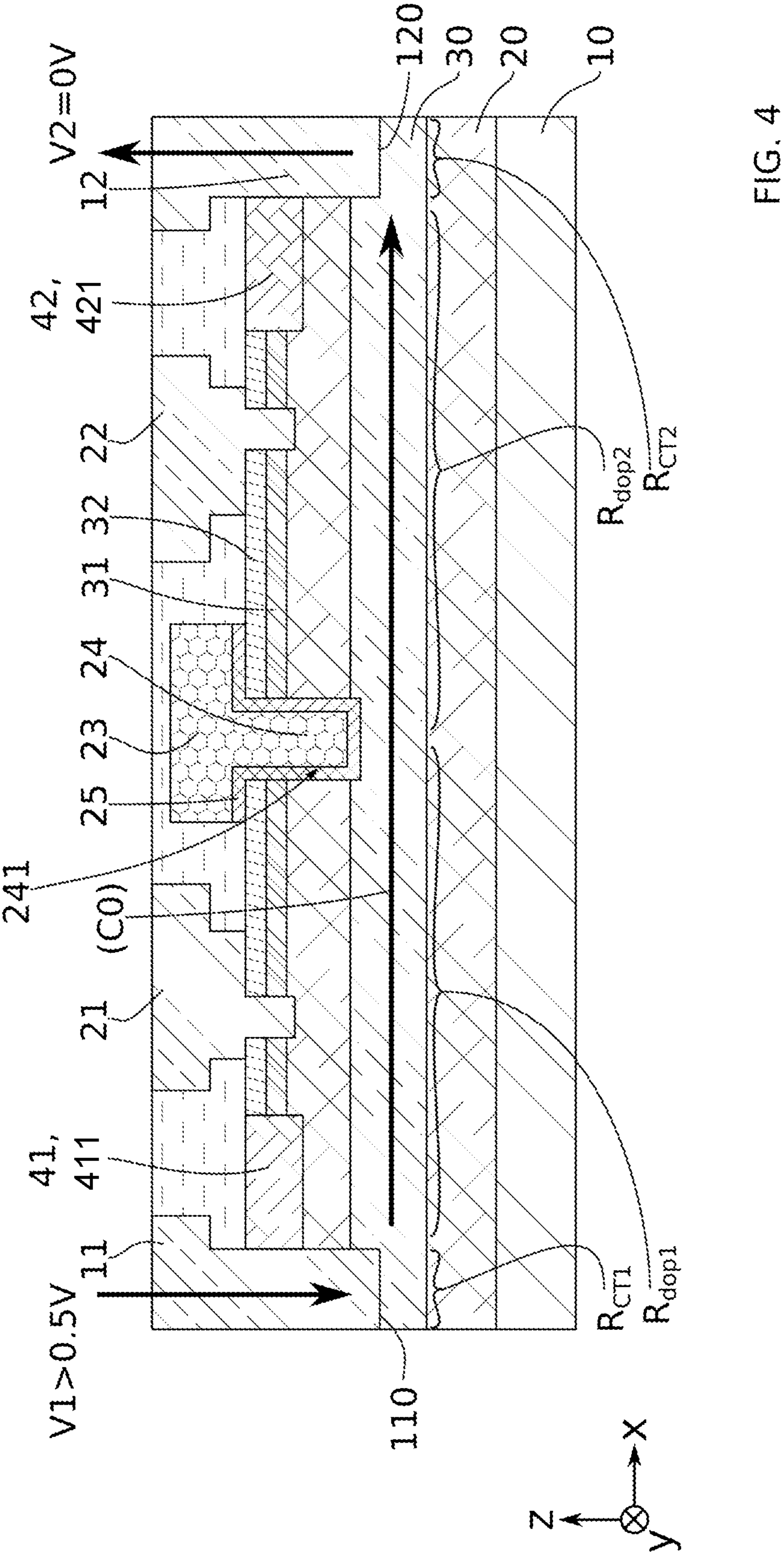
FIG. 4 schematically illustrates another conduction path in a test structure according to an embodiment of the present invention.

FIG. 4 illustrates another embodiment where the insulation structures 41, 42 are formed by insulation wells 411, 421. As above, these wells 411, 421 are configured to extend through the layers 31, 32, and partially into the substrate 20 over a depth greater than the confinement thickness of the 2DEG. This makes it possible to locally remove the 2DEG and the conduction path between the test contacts and the transistor contacts. The wells 411, 421 can be formed by chemical etching, then filled by a dielectric material, for example $SiO_2$ or SiN.

Figure 5:
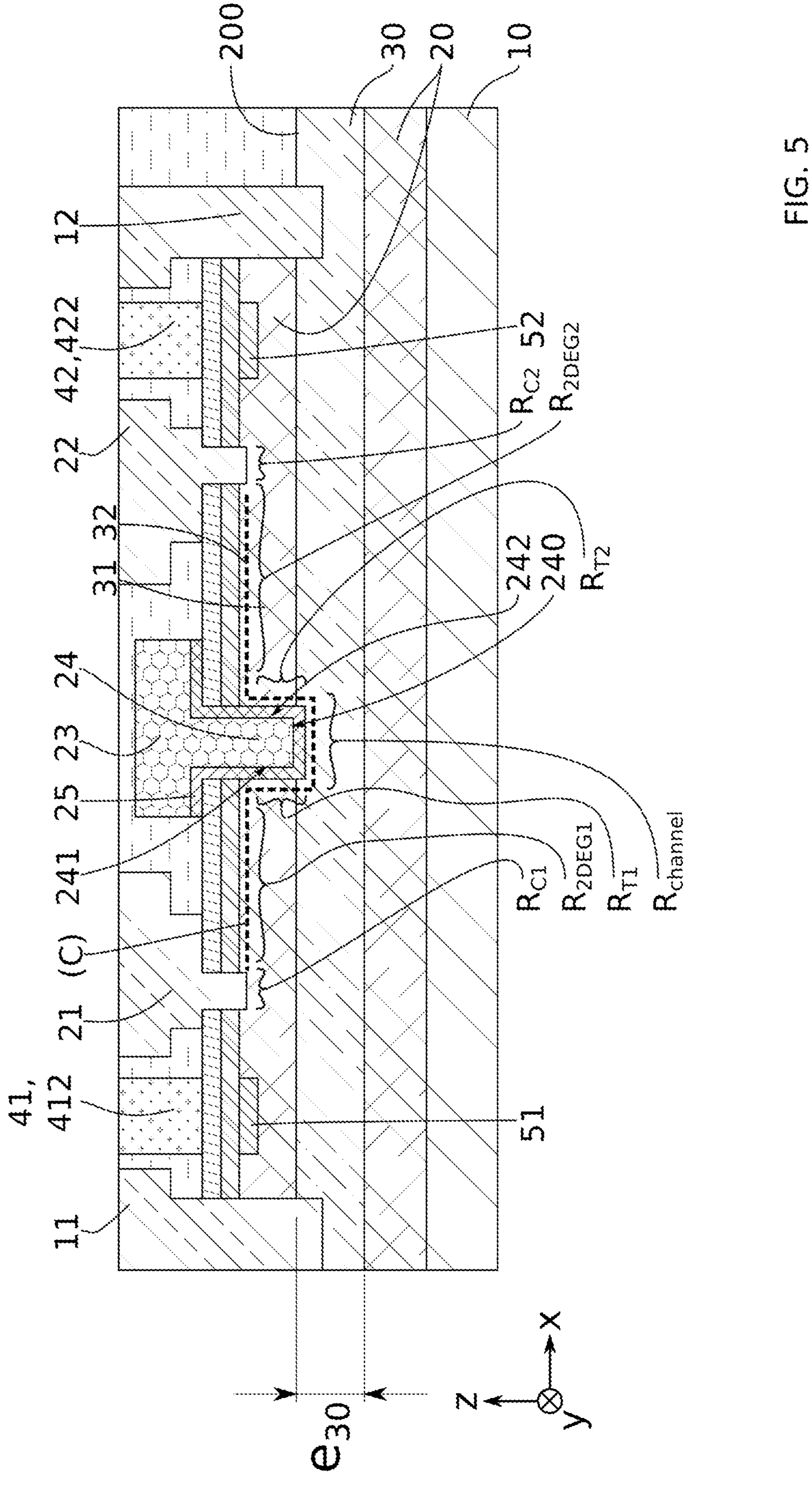
FIG. 5 schematically illustrates a test structure according to another embodiment of the present invention.

FIG. 5 illustrates another embodiment where the insulation structures 41, 42 are formed by transistors 412, 422 disposed at the surface 200 of the substrate 20. In this embodiment, it is not necessary to structure the substrate 20 under the surface 200. Typically, the gates of the transistors 412, 422 are formed on the layer 32, respectively between the first test contact 11 and the first transistor contact 21, and between the second test contact 12 and the second transistor contact 22. The transistors 412, 422 thus formed are typically of the "normally on" type. It is therefore possible to block the conduction between the first test contact 11 and the first transistor contact 21, and between the second test contact 12 and the second transistor contact 22, by negatively polarising the gates of the transistors 412, 422 below the threshold voltages Vth of these transistors 412, 422. The threshold voltages Vth of these transistors 412, 422 are typically around −8V. Thus, by polarising the gates of the transistors 412, 422 for example at Vgs=−15V with respect to the transistor contacts 21, 22, depleted zones 51, 52 appear and block the conduction under the gates of the transistors 412, 422.

The test structure 1 can advantageously be implemented in order to separately measure $R_{T1}$ and $R_{T2}$.

Figure 6:
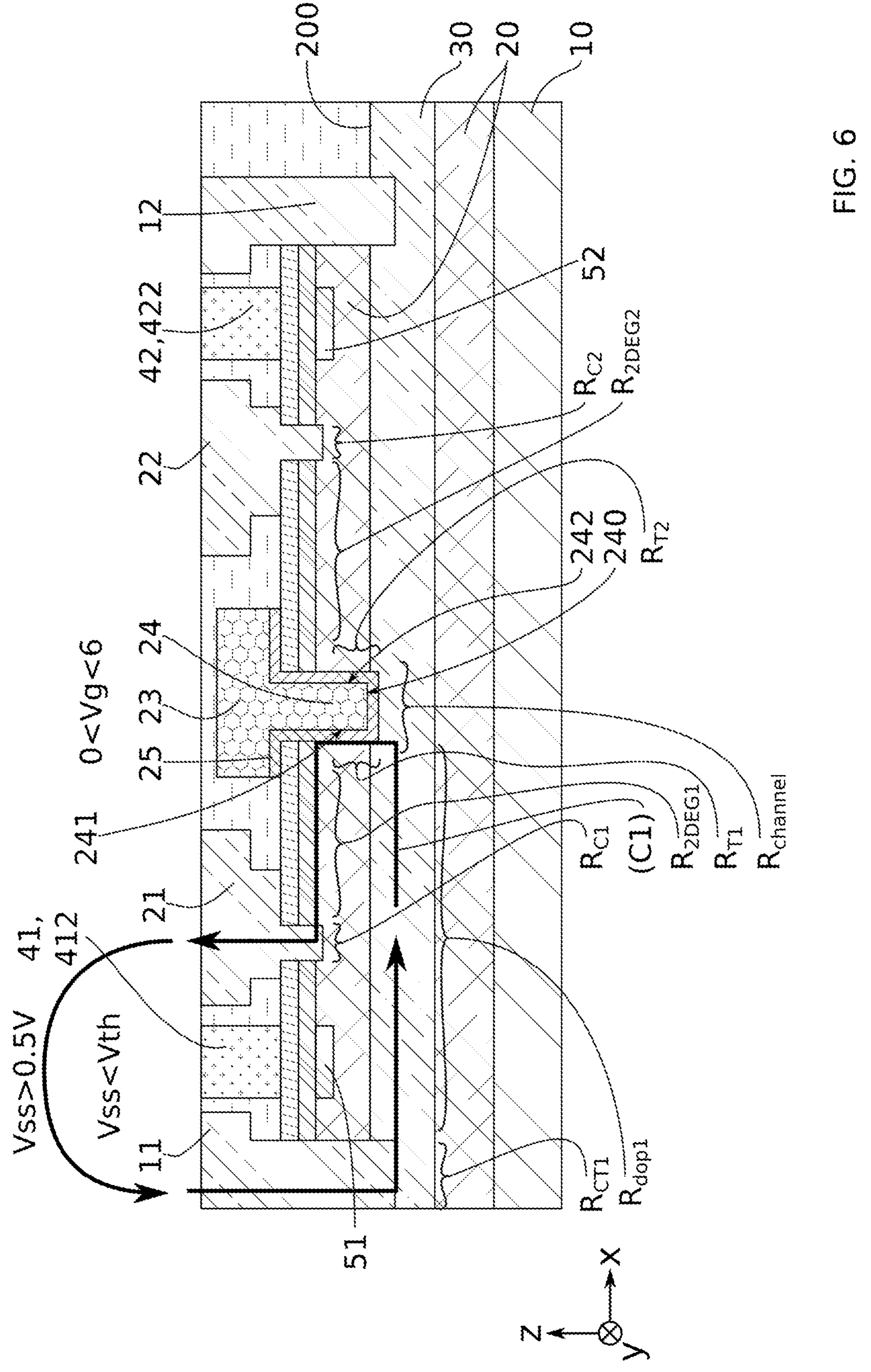
FIG. 6 schematically illustrates a first conduction path in the test structure illustrated in FIG. 5, according to an embodiment of the present invention.

As illustrated in FIGS. 3 and 6 for different embodiments of the insulation structures 41, 42, by positively polarising the first test contact 11 vis-à-vis the first transistor contact 21, for example according to Vss>0.5V, a current I1 is established along the conduction path (C1) corresponding to the resistance portions $R_{CT1}$, $R_{dop1}$, $R_{T1}$, $R_{2DEG1}$, $R_{C1}$. It is thus possible to determine the resistance $R_{T1}$ along the side 241 of the buried part 24 of the gate 23, according to:

$$R_{T1} = \frac{V_{SS}}{I_1} - R_{2DEG1} - R_{C1} - R_{CT1} - R_{dop1}$$

The resistances $R_{2DEG1}$, $R_{C1}$ can be determined, moreover, for example according to the known methods mentioned above.

The sum of the resistances $R_{dop1}+R_{CT1}$ can be advantageously determined via the same test structure 1, by modifying the connections and polarisations of the different contacts 11, 21, 23, 22, 12.

As illustrated in FIG. 4, by positively polarising the first test contact 11 vis-à-vis the second test contact 12, for example with V1>0.5V and V2=0V, without polarising the transistor contacts 21, 22 and the gate 23, a current I is established along the conduction path (C0) corresponding to the portions of resistances $R_{CT1}$, $R_{dop1}$, $R_{dop2}$, $R_{CT2}$. It is thus possible to determine the sum of the resistances $R_{dop1}+R_{CT1}+R_{dop2}+R_{CT2}$, which, in the case of a symmetrical test structure, is substantially equal to $2.R_{CT}+2.R_{dop}$, according to:

$$\frac{V1 - V2}{I} = R_{CT1} + R_{dop1} + R_{CT2} + R_{dop2}$$

In the case of a symmetrical test structure as illustrated in FIG. 4, $R_{dop1} \approx R_{dop2} \approx R_{dop}$ and $R_{CT1} \approx R_{CT2} \approx R_{CT}$.

It is thus possible to extract $R_{dop1}+R_{CT1}$ according to:

$$R_{CT1} + R_{dop1} = R_{CT} + R_{dop} = \frac{V1 - V2}{2I}$$

The test structure 1 thus makes it possible to individually determine $R_{T1}$.

Similarly, the test structure 1 makes it possible to individually determine $R_{T2}$, by positively polarising the second test contact 12 vis-à-vis the second transistor contact 22 (not illustrated).

The invention is not limited to the embodiments described above.

The invention claimed is:

1. A device comprising:

a substrate;

a test structure;

a buried gate transistor;

wherein said buried gate transistor comprises:

a gate having a buried part buried in the substrate, a gate dielectric electrically insulating the gate from the substrate, a first contact of the buried gate transistor located on a first side of the gate, and a second contact of the buried gate transistor located on a second side of the gate, opposite the first side, and wherein said test structure comprises:

a first test contact located on a side of the first contact of the buried gate transistor opposite the gate, a second test contact located on a side of the second contact of the buried gate transistor opposite the gate, a buried layer buried within the substrate and having a doping greater than or equal to $10^{18}$ $cm^{-3}$ and having an upper face, a first insulation structure configured to electrically insulate the first test contact from the first contact of the buried gate transistor, and a second insulation structure configured to electrically insulate the second test contact from the second contact of the buried gate transistor, and wherein the first contact of the buried gate transistor and the second contact of the buried gate transistor each have a bottom face spaced above the upper face of the buried layer, wherein the first test contact and the second test contact each extend through a portion of the substrate and have a bottom face located within the buried layer, wherein the upper face of the buried layer is parallel to a bottom face of the gate dielectric, and wherein a plane of the upper face of the buried layer passes within the gate dielectric such that the buried layer intercepts a conduction path of the buried gate transistor.

2. The device according to claim 1, wherein the first and second insulation structures respectively comprise first and second amorphous zones.

3. The device according to claim 1, wherein the first and second insulation structures respectively comprise first and second wells based on a dielectric material.

4. The device according to claim 1, wherein the first and second insulation structures respectively comprise first and second insulation structure transistors.

5. The device according to claim 1, wherein the buried gate transistor comprises a barrier layer formed directly on the substrate and configured to form a two-dimensional electron gas (2DEG) confined under the barrier layer in the substrate, wherein the 2DEG gas forms the conduction path, the first and second contacts of the buried gate transistor passing through said barrier layer to the substrate.

6. The device according to claim 5, wherein the substrate is GaN-based and the buried layer is N-doped GaN-based.

7. The device according to claim 5, wherein the first and second insulation structures pass through the barrier layer.

8. The device according to claim 1, wherein the buried layer has a thickness greater than or equal to 100 nm.

9. The device according to claim 1, wherein the first and second contacts of the buried gate transistor are symmetrically disposed on the first and second sides of the gate, respectively, and wherein the first and second test contacts are symmetrically disposed on the first and second sides of the gate, respectively.

10. The device according to claim 1, wherein the doping of the buried layer is between $10^{19}$ and $10^{20}$ $cm^{-3}$.

11. The device according to claim 1, wherein the first contact of the buried gate transistor is a drain contact and the second contact of the buried gate transistor is a source contact.

12. The device according to claim 1, wherein the gate is located laterally between the first and second contacts of the buried gate transistor.

13. The device according to claim 1, wherein the first and second insulation structures are buried within the substrate.

14. The device according to claim 1, further comprising:

a barrier layer formed directly on the substrate and configured to form a two-dimensional electron gas (2DEG) confined under the barrier layer in the substrate, a first conduction path using the first and second contacts of the buried gate transistor and the buried layer; and a second conduction path using the first contact of the buried gate transistor, the first test contact, and a portion of the 2DEG located between the first test contact and the first contact of the buried gate transistor.

* * * * *